(12) United States Patent
Hwang et al.

(10) Patent No.: US 6,215,364 B1
(45) Date of Patent: Apr. 10, 2001

(54) VARIABLE FREQUENCY OSCILLATOR, AND PHASE LOCKED LOOP AND CLOCK SYNCHRONIZER USING THEREOF

(75) Inventors: Changku Hwang, Palo Alto, CA (US); Masaru Kokubo, Hanno (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/288,689

(22) Filed: Apr. 9, 1999

(30) Foreign Application Priority Data

Apr. 13, 1998 (JP) .................................................. 10-101423

(51) Int. Cl.$^7$ ...................................................... H03B 5/02
(52) U.S. Cl. ........................ 331/57; 331/177 R; 331/1 A; 331/34; 327/274; 327/270
(58) Field of Search .................................. 331/57, 34, 25, 331/1 A, 177 R; 327/270, 274

(56) References Cited

U.S. PATENT DOCUMENTS 5,896,069 * 4/1999 Williams et al. ........................ 331/57

OTHER PUBLICATIONS

IEEE Journal of Solid–State Circuits, vol. SC–29, Mar. 1994, "Cell–Based Fully Integrated CMOS Frequency Synthesizers", D. Mijuskovic et al, pp. 271–279.

IEEE ISSCC '95 Digest of Technical Papers, Feb. 1995, "Fully Integrated CMOS Phase–Locked Loop with 15 to 240 MHz Locking Range and + 50 ps Jitter", I. Novof, pp. 112–113.

IEEE Press, 1996, "Design of Monolithic Phased–Locked Loop and Clock Recovery Circuits", B. Razavi, pp. 1–39.

* cited by examiner

Primary Examiner—Arnold Kinkead
(74) Attorney, Agent, or Firm—Mattingly, Stanger & Malur, P.C.

(57) ABSTRACT

The variable frequency oscillator is capable of operation at a low power supply voltage and oscillating at a high frequency. A phase locked loop and a clock synchronizer use the variable frequency oscillator and have a wide oscillation frequency range. The variable frequency oscillator has plural delay cells which are cascaded and the output of the final stage delay cell is fed back to the input of the first stage delay cell. Each of the delay cells includes a differential amplifier and a positive feedback circuit, connected with input and output terminals intersecting with each other. The feedback circuit has complementary amplifiers each having an input terminal formed by connecting together gates of a pMOS and an nMOS transistor and an output terminal formed by connecting together the drains thereof. The positive feedback circuit, provided between output terminals of the differential amplifier, a controlling MOS transistor for inputting a frequency control signal for controlling the source current of the complementary amplifier to the gate thereof and the complementary amplifiers are connected in series between a power supply terminal and a ground terminal.

16 Claims, 13 Drawing Sheets

VARIABLE FREQUENCY OSCILLATOR, AND PHASE LOCKED LOOP AND CLOCK SYNCHRONIZER USING THEREOF

BACKGROUND OF THE INVENTION

The present invention relates to a phase locked loop (hereinafter, referred to as "PLL") using a variable frequency oscillator, particularly to a variable frequency oscillator preferably applied to a semiconductor integrated circuit device operated at low power supply voltage.

A large-scaled semiconductor integrated circuit device (hereinafter, referred to as "LSI") integrated with a microprocessor has been developed intensively and large scale formation, high speed formation and low power consumption have been achieved and are being improved. A microprocessor is an operation device for executing operations as instructed by a program or the like and is operated in synchronism with clocks. A frequency synthesizer using a PLL is well known as a circuit for generating clocks (refer to, for example, D. Mijuskovic et al. "Cell Based Fully Integrated CMOS Frequency Synthesizer", IEEE Journal of Solid-State Circuits, Vol. SC-29 (issued in March, 1994), p.271–p.279). FIG. 11 shows a constitution of a frequency synthesizer generally used in LSI.

In FIG. 11, a feedback loop is formed by a phase detector 1, a loop filter 3 and a current controlled oscillator 7. The current controlled oscillator 7 (hereinafter, abbreviated as "ICO") outputs a clock signal fvco in synchronism with a reference signal fr from outside. ICO 7 is a variable frequency oscillator for changing an oscillation frequency in accordance with an input current. Further, a divider 9 is a divider for generating the reference signal for dividing an input signal fi at a low frequency inputted from a quartz oscillator or the like from the outside. A divider 8 is a divider for feedback inserted into the feedback loop and by pertinently setting respective numbers of divisions of both, the clock signal fvco at a predetermined frequency can be provided. Further, a comparison signal fp to the phase detector 1 is outputted from the divider 8.

In this case, the basic function of the constitution shown by FIG. 11 resides in PLL for forming a signal the phase of which is synchronized with that of the input signal by the feedback loop. Installation of the dividers 8 and 9 is arbitrary and PLL functions particularly as a frequency synthesizer by installing these. Further, PLL constitutes a clock generating circuit when an output signal is a clock signal.

When such a frequency synthesizer is formed by LSI, there is adopted a constitution in consideration of special properties of a semiconductor integrated circuit. That is, in a semiconductor integrated circuit, there is a case in which although a capacitor is easy to provide, a resistor is difficult to form and formation of inductance is very difficult. Hence, the loop filter 3 is formed by a capacitor, charge and discharge of a current to and from the capacitor is carried out by a charge pump 2 and the loop filter 3 is bypassed by installing an auxiliary charge pump (hereinafter, abbreviated as "ACP") 5. ACP 5 executes an operation equivalent to that of a resistor and forms a zero point in a transfer function of the feedback loop. By providing the zero point, the feedback loop is stabilized.

The phase detector 1 detects a phase difference between the reference signal fr and the output signal fp of the divider 8 and outputs UP signal (a control signal for increasing a frequency) and DN signal (a signal decreasing a frequency) for controlling ICO 7. Further, at the same time, ICO 7 outputs UPB signal and DNB signal which respectively constitute inverted signals of UP signal and DN signal. The UP signal and DN signal are pulse width modulation signals in correspondence with the phase difference between the reference signal fr and the comparison signal fp.

Further, when ICO 7 is constituted of a semiconductor integrated circuit, there is a tendency in which improvement of linearity of a relationship between an oscillation frequency and a current is more facilitated than that of a relationship between an oscillation frequency and a voltage and accordingly, ICO 7 is adopted more preferably than a voltage controlled oscillator (VCO) and a voltage-to-current converter (hereinafter, abbreviated as "VIC") 4 converts a voltage across terminals of a capacitor of the loop filter 3 into a current. Further, ACP 5 is constituted to output a current and accordingly, the output currents from the VIC 4 and ACP 5 are added at an adder 6 for forming the above-described bypass.

Next, an explanation will be given of principal circuits of such PLL. FIG. 12 shows constitutions of the charge pump 2 and the loop filter 3. The charge pump 2 is constituted of switches 12 and 13 comprising 2 sets of transistors and current sources 10 and 11 and inputs UP signal and DNB signal from the phase detector 1. In this case, UP signal and DN signal are effective when they are 0. Further, the loop filter 3 is connected to an output of the charge pump 2 and is constituted of a capacitor Cp.

The charge pump 2 charges and discharges electric charge in correspondence with inputted UP signal and inputted DNB signal from electric charge stored in the capacitor Cp of the loop filter 3. In this case, amounts of electric charge which are charged and discharged become values derived from current values Iup and Idn of the current sources 10 and 11 constituting the charge pump 2 multiplied by a difference between a pulse width of UP signal and a pulse width of DNB signal.

FIG. 13 shows an example of VIC 4 for converting a voltage across terminals of a capacitor into a current (refer to, for example, Ilya Novof "Fully Integrated CMOS Phase-Locked Loop with 15 to 240 MHz Locking Range and ±50 ps Jitter", IEEE ISSCC '95 Digest Technical Papers (issued in February, 1995) p.112–p.113).

Such VIC is provided with a circuit constitution in which 3 stages or more of transistors each operating in a saturation region are cascaded and 3 V or more of power supply voltage is needed.

Successively, owing to special properties of a semiconductor integrated circuit mentioned above and a request for high speed operation, ICO 7 is normally constituted of a ring oscillator which plural delay cells of a current control type having gain are cascaded and the output of the final stage delay cell is fed back to the input of the first delay cell (refer to, for example, B. Razavi "Design of Monolithic Phase-Locked Loops and Clock Recovery Circuits", p.1–p.39, issued by IEEE Press, 1996).

FIG. 14 shows an example of a delay cell. Transistors M21 and M22 for inputting differential signals Vin signal polarities of which are inverted each other and outputting divided signals vout constitute a differential amplifier and transistors M23 and M24 constitute load resistances of these. Transistors M25 and M26 connected to respective output terminals of the differential amplifier constitute a positive feedback circuit and negative resistance formed by the positive feedback cancels the above-described load resistances. Thereby, the load resistances are increased apparently. Further, each of the transistors M25 and M26 is an amplifier having a gate electrode as an input terminal and a drain electrode as an output terminal and the positive feedback circuit is constituted of connecting the input and output terminals to intersect with each other.

Transistors M27 and M28 for inputting a frequency control signal Vcont respectively change a common source current of the transistors M23 and M24 and a common source current of the transistors M25 and M26 and change the apparent load resistances mentioned above. Although not illustrated, the output terminal of the amplifier is provided with parasitic capacitance and a time constant is formed by the parasitic capacitance and the apparent load resistance, and the time constant is changed by changing the apparent load resistance. That is, a delay amount of the delay cell is changed by current to thereby change the oscillation frequency of ICO 7 which is a ring oscillator in which the plural delay cells are cascaded and the output of the final stage delay cell is fed back to the input of the first stage delay cell.

According to the delay cell of FIG. 14, power supply voltage is restrained low by constructing a constitution in which the transistors M27 and M28 are not cascaded to the transistors M21 and M22. However, the transistors of the amplifier and the current source are used in the saturation region, the output terminal of the amplifier is connected to an input terminal of an amplifier of a delay cell at a post stage and the like, accordingly, the power source voltage needs to be about 3 times as much as gate-to-source voltage of the transistor, specifically 2.5 V at minimum.

SUMMARY OF THE INVENTION

According to LSI integrated with a microprocessor, dimensions of a semiconductor element become very small in accordance with large scale formation and accordingly, transistor breakdown voltage is lowered and low voltage formation of power supply has been progressed. The voltage which used to be 5 V has become 3 V and recently, there is a trend of lowering the voltage to about 1 V. Further, low voltage formation of power supply directly contributes to a reduction in power consumption of LSI. Further, other than large scale formation of LSI, in accordance with enlargement of application, there has been an increase in the operational speed and enlargement of a frequency variable range.

According to the conventional respective circuits mentioned above, an object of the power source voltage is around 3 V and when the power source voltage is lowered to about 1 V, the following problem is posed.

According to ICO 7, the gain of the delay cell is reduced by lowering the operational current of the transistor and the gain of the delay cell at a vicinity of oscillation frequency may become lower than 1. In this case, the variable range of the frequency is narrowed and depending on cases, the oscillation may be stopped. As a countermeasure, although a method of increasing a cascade stage number of delay cells is conceivable, the upper limit of the oscillation frequency is lowered, power consumption is increased and accordingly, the method cannot be regarded as an appropriate improvement.

According to VIC 4, a transistor which has been operated in the saturation region shifts to a resistor region (non-saturation region) and in the procedure, the voltage-to-current conversion having excellent linearity cannot be executed.

Next, with regard to the variable range of the oscillation frequency, according to the circuit constitution bypassed by ACP 5 shown by FIG. 11, there is a problem stated below where widening of the variable range is difficult.

When UP signal or DN signal is generated, the current is instantaneously added and accordingly, the oscillation frequency is brought into a state in which it jumps to change for a short period of time. In this case, when a normal frequency is designated by notation fo and its period is designated by notation T and an instantaneous amount of frequency change and an instantaneous amount of period change are respectively designated by notations Δf and ΔT, the following equation (1) is established.

$$\Delta T/T \approx f/fo \quad (1)$$

Accordingly, when UP signal and DN signal are added or subtracted relatedly as they are as in the case of using conventional ACP 5, Δf stays constant and accordingly, an error ΔT/T of period is increased as fo becomes lower. That is, jitter (fluctuation over time) is increased. There is an allowable limit in the magnitude of jitter and therefore, fo cannot be lowered to a certain degree or less and the variable range of the oscillation frequency is narrowed.

It is an object of the invention to resolve the above-described problems of the conventional technologies and to provide a novel variable frequency oscillator capable of oscillating at a high frequency as well as PLL and a clock synchronizer using thereof and having a wide oscillation frequency range.

The most significant feature of the present invention resides in that a variable frequency oscillator adopts delay cells each constituted such that a complementary amplifier having an input terminal by connecting together gate electrodes of a pMOS (Metal Oxide Semiconductor) and an nMOS transistor and an output terminal by connecting together drain electrodes thereof is adopted as an amplifier element, a differential amplifier and a positive feedback circuit connected with input and output terminals intersected with each other are constituted of using the complementary amplifiers, the positive feedback circuit is connected between the output terminals of the differential amplifier and a controlling MOS transistor for controlling source currents of the complementary amplifiers and the complimentary amplifiers are connected in series between a power supply terminal and a ground terminal.

According to the constitution of the delay cells, source electrodes of the pMOS transistors of the complementary amplifiers used in the differential amplifier and the positive feedback circuit are connected together, further, source electrodes of the nMOS transistors are connected together. Further, a frequency control signal is supplied to a gate electrode of the controlling MOS transistor and a drain current of the controlling MOS transistor constitutes a control current for controlling source currents of the complementary amplifiers.

The complementary amplifier can be used as an inverter in which when one transistor is brought into an ON state (resistor region), other transistor is brought into an OFF state. According to the present invention, by using the complementary amplifier as such an inverter, the differential amplifier constitutes a differential circuit of the inverters states of which are inverted from each other and the positive feedback circuit constitutes a latch circuit. Accordingly, voltage for operating the differential amplifier and the positive feedback circuit can be made voltage for bringing one transistor into an ON state, that is, substantially threshold voltage of the transistor (application of voltage is not necessary to a transistor in an OFF state). Specifically, the voltage is about 0.7 V.

In the meantime, although it is necessary to maintain the saturation region in the controlling MOS transistor for controlling the source currents of the complementary amplifiers, the drain-to-source voltage therefor becomes about 0.3 V. Accordingly, the delay cell according to the present invention becomes operable by power source voltage of 1 V produced by adding 0.3 V to the above-described threshold voltage 0.7 V.

Next, the positive feedback circuit detects a very small voltage difference outputted from the differential amplifier and accelerates the output terminal to change in a direction from power source potential to ground potential or a direction reverse thereto and accordingly, the delay cell can not only be provided with high gain apparently but also can execute high speed operation. Further, a number of stages of cascading the delay cells can be reduced.

In this way, according to the variable frequency oscillator constituted of using the delay cells of the present invention, lowering of gain is not caused under low power supply voltage and the oscillator oscillates stably.

Other feature of the present invention resides in that a circuit comprising a first MOS transistor the gate electrode of which is biased to voltage higher than that of the drain voltage and a second MOS transistor in which an output voltage of a loop filter is inputted to the gate electrode, an output current is outputted from the drain electrode and the source electrode is connected to the drain electrode of the first MOS transistor, constitutes a voltage-to-current converting unit of a voltage-to-current converter. The above-described bias can be realized by, for example, connecting the gate electrode to power supply.

The transistor biased as mentioned above operates in the resistor region and conducts a behavior substantially the same as that of a resistor at low voltage of power supply voltage of about 1 V. By constituting a source resistor by such a resistor, according to the second MOS transistor, linear voltage-to-current conversion can be carried out under low power supply voltage. Thereby, a converted current having a wide linear range is obtained and a wide operational range of PLL is ensured in accordance therewith.

Still other feature of the present invention resides in that an auxiliary charge pump is constituted of a first current source and a second current source, a first differential circuit for inputting UP signal and UPB signal and switching a current of the first current source, a second differential circuit for inputting DN signal and DNB signal and switching a current of the second current source and a current mirror circuit for copying a current outputted from the second differential circuit when DN signal is effective, and a terminal constituted of connecting a terminal to which the second differential circuit outputs the current when UP signal is effective and a terminal to which the current mirror circuit outputs the copied current constitutes an output terminal of the auxiliary charge pump and further preferably, the currents of the first current source and the second current source are changed in proportion to an output signal of the loop filter.

By setting such a proportional relationship, according to PLL having the proposed auxiliary charge pump, $\Delta f$ of the above-described Equation (1) becomes proportional to fo and the period error $\Delta T/T$ becomes constant regardless of the frequency. Therefore, even when the oscillation frequency is reduced, jitter is not increased and PLL can obtain a wide oscillation frequency range.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

A further detailed explanation will be given of a variable frequency oscillator as well as PLL and a clock synchronizer using thereof according to the present invention in reference to several embodiments shown by the drawings. Incidentally, the same notations in FIG. 1 through FIG. 14 designate the same or similar portions.

(Embodiment 1)

Figure 1:
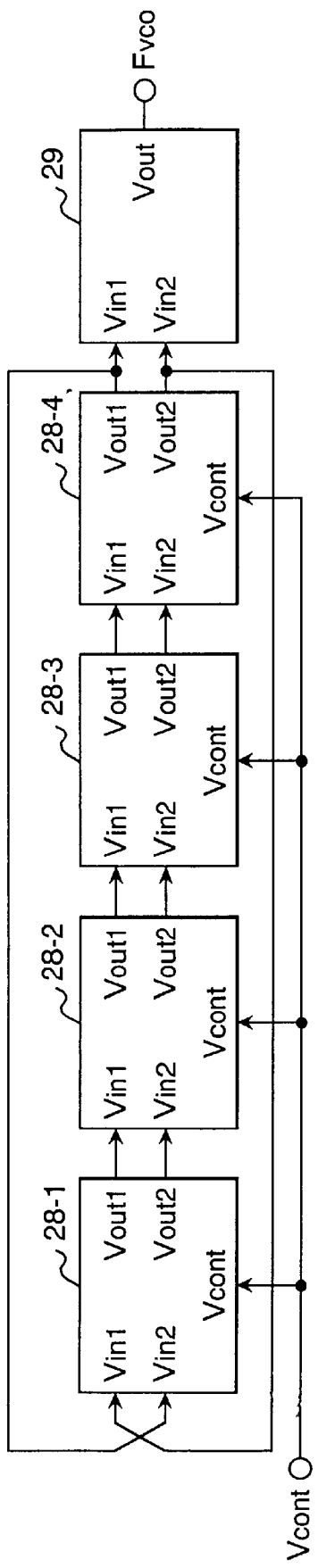
FIG. 1 is a constitution diagram for explaining a first embodiment of a variable frequency oscillator according to the present invention.
Figure 2:
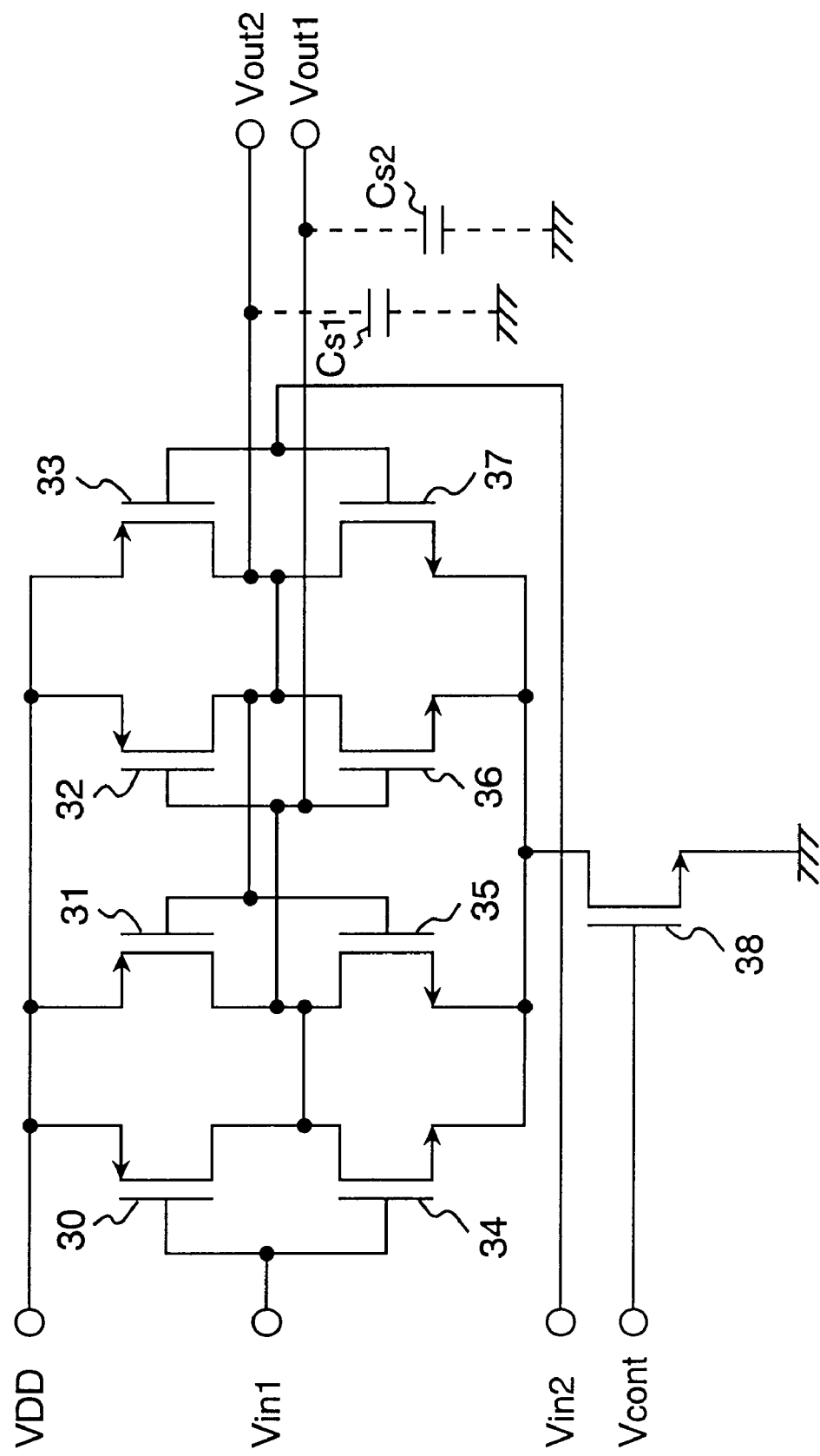
FIG. 2 is a circuit diagram for explaining an example of a delay cell used in the variable frequency oscillator according to the first embodiment.

According to a variable frequency oscillator of the embodiment, plural delay cells shown by FIG. 2 are cascaded and the output of the final stage delay cell is fed back to the input of the first stage delay cell and its circuit constitution is shown by FIG. 1. In FIG. 1, notations 28-1 through 28-4 designate delay cells each having differential input and output terminals and numeral 29 designates a differential-to-single-ended signal converter for converting two differential output signals from the delay cell 28-4 into a single-ended signal. The delay cells 28 input differential signals Vin1 and Vin2 and output differential signals Vout1 and Vout2. In FIG. 2, numerals 30 through 33 designate pMOS transistors, numerals 34 through 38 designate nMOS transistors, and the transistors 30 and 34, 31 and 35, 32 and 36, and 33 and 37 constitute complementary amplifiers in each of which gate electrodes are connected to each other to thereby constitute an input terminal and drain electrodes are connected to each other to thereby constitute an output terminal. The complementary amplifier is provided with high gain since it operates such that one transistor becomes a load of other transistor.

By connecting source electrodes of the pMOS transistors 30 through 33 of the respective complementary amplifiers to each other and connecting source electrodes of the nMOS transistors 34 through 37 to each other, a differential amplifier is constituted of the complementary amplifiers for inputting the signals Vin1 and Vin2 and a positive feedback circuit is constituted of 2 of the complementary amplifiers in which input and output terminals are connected to intersect with each other and output terminals of the differential amplifiers are connected thereto. In this way, the complementary amplifier is used as an element of the amplifier. Further, the complementary amplifiers and the nMOS transistor 38 for current control are connected in series between a power supply terminal (power supply voltage VDD) and a ground terminal.

In this case, the output terminals of the differential amplifiers are added with parasitic capacitances Cs1 and Cs2 produced by output capacitances, parasitic capacitances of a metal layer, input capacitances at successive stages and so on of the complementary amplifiers.

When the differential signals Vin1 and Vin2 are inputted to the delay cell, the differential amplifier charges and discharges the capacitances Cs1 and Cs2 to thereby form the differential outputs. A delay amount of the delay cell is determined by discharge currents and the capacitances Cs1 and Cs2 and accordingly, operation of the variable delay cell is executed such that the discharge currents are determined only by the controlling transistor 38 for current control. Accordingly, a current supply ability of the transistor 38 is made to exceed a current supply ability of the transistor 34 or 37.

The transistor 38 inputs a frequency control signal Vcont and outputs a control current constituting the discharge currents. Further, although mentioned later, the transistor 38 constitutes a post-stage of a current mirror circuit and in the current mirror circuit, a gate-to-source voltage of a transistor at a pre-stage for copying input current is formed as the frequency control signal Vcont. Further, the controlling transistor 38 for current control is not limited to the ground side shown by FIG. 2 but can be arranged at the power supply side. A transistor in that case is a pMOS transistor and the polarity of an inputted frequency control signal is reverse to that of the above-described signal.

According to the present invention, in order to make the power source having low voltage, when either one of the transistors of the complementary amplifier is brought into an ON state, other one of the transistors is brought into an OFF state. The transistor 38 is operated in the saturation region to carry out current control. In a transistor in the ON state (resistor region), threshold voltage (about 0.7 V) is applied between the gate and the source and in a transistor in the OFF state, voltage is not needed. In the meantime, voltage necessary for shifting to the saturation region (about 0.3 V) is applied between the drain and the source of the transistor 38. Accordingly, the power supply voltage VDD is set with 1 V where 0.3 V of the saturation voltage is added to 0.7 V of the threshold voltage as a lower limit.

The complementary amplifier operating in the ON and the OFF states constitute an inverter, the above-described differential amplifier operates as a differential circuit of the inverters states of which are inverted to each other and the positive feedback circuit operates as a latch circuit. The complementary amplifier is provided with high gain and therefore, such operations are carried out at high speed, further, a number of cascading the delay cells in the variable frequency oscillator can be reduced.

When the signals Vin1 and Vin2 are inputted to the differential amplifier and a very small voltage difference is caused between the output signals Vout1 and Vout2, the positive feedback circuit operating as a latch circuit, detects the voltage difference, accelerates the differential output signals Vout1 and Vout2 to change in a direction of the power supply voltage or the ground potential and operates such that a sufficient amplitude is ensured in the differential output. Therefore, the delay cell can be provided with high gain apparently.

Further, in order to carry out stable operation, voltage-to-current conversion gain of each transistor of the differential amplifier needs to be larger than voltage-to-current conversion gain of each transistor of the positive feedback circuit. Hence, a gate width of each transistor of the differential amplifier is set to be larger than a gate width of each transistor of the positive feedback circuit. In the case of a reversed setting, stoppage of oscillation is resulted.

As shown by FIG. 1, the variable frequency oscillator is constructed by a constitution in which the plural delay cells 28-1 through 28-4 are cascaded and the output of the final stage delay cell is fed back to the input of the first stage delay cell. The control signal Vcont is simultaneously supplied to the respective delay cells. The oscillation frequency is determined by the delay amount of the delay cells 28-1 through 28-4 and accordingly, there can be provided the variable frequency oscillator the oscillation frequency of which is controlled by control current of the transistors 38 of each of delay cells 28-1 through 28-4, that is, ICO.

In the meantime, each of the delay cells 28-1 through 28-4 is a circuit inverting phases of input and output and accordingly, connection of the delay cell 28-4 at the final stage to the delay cell 28-1 of the initial stage, is reverse to other connection. Further, although the variable frequency oscillator is constituted of cascading 4 stages of the delay cells, a number of stages is not limited thereto but may be other number of stages of an even number.

Figure 3:
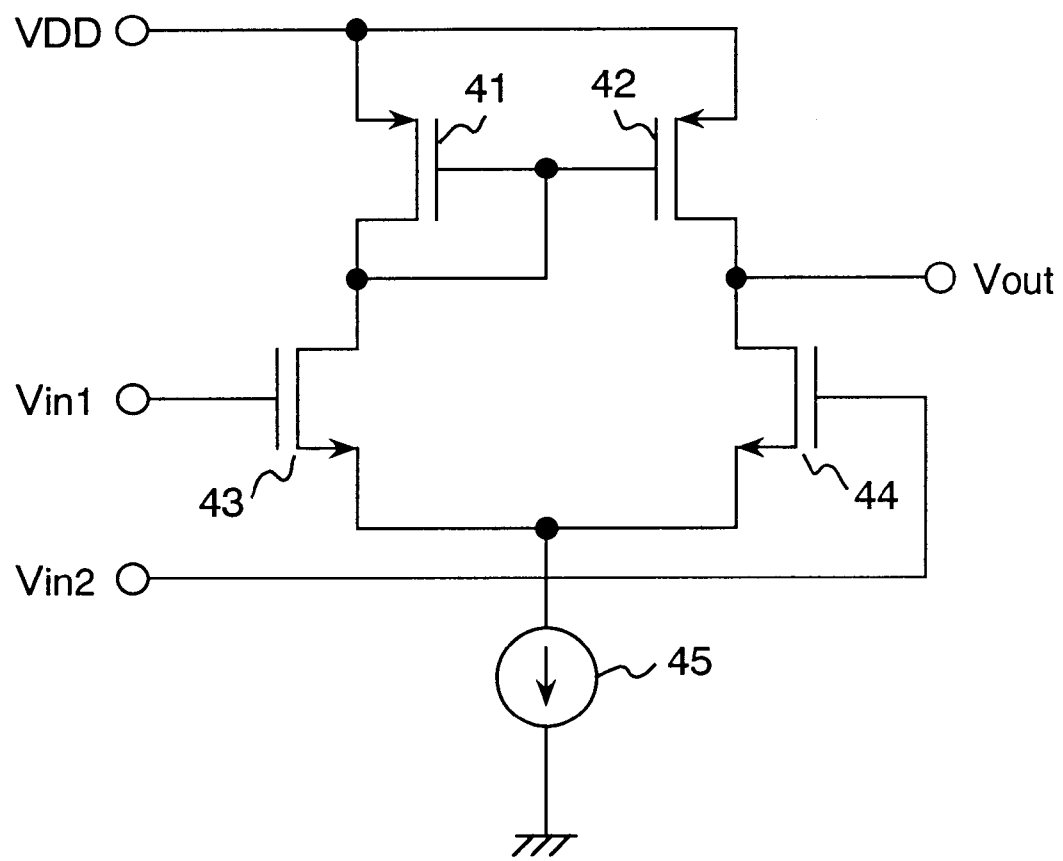
FIG. 3 is a circuit diagram for explaining an example of a differential-to-single-ended signal converter used in the variable frequency oscillator according to the first embodiment.

Next, FIG. 3 shows an example of the constitution of the differential-to-single-ended single converter (hereinafter, abbreviated as "DSC") 29 shown by FIG. 1. DSC 29 comprises four transistors 41, 42, 43 and 44 constituting a differential amplifier. The differential input signals Vin1 and Vin2 (differential output signals Vout1 and Vout2 of the delay cell 28-4) are amplified by the differential amplifier of a source coupling type constituted of the transistors 43 and 44 and are converted into a single-ended digital signal fvco having an amplitude necessary for a digital signal by the two transistors 41 and 42 connected to drain electrodes of the transistors 43 and 44.

Figure 4:
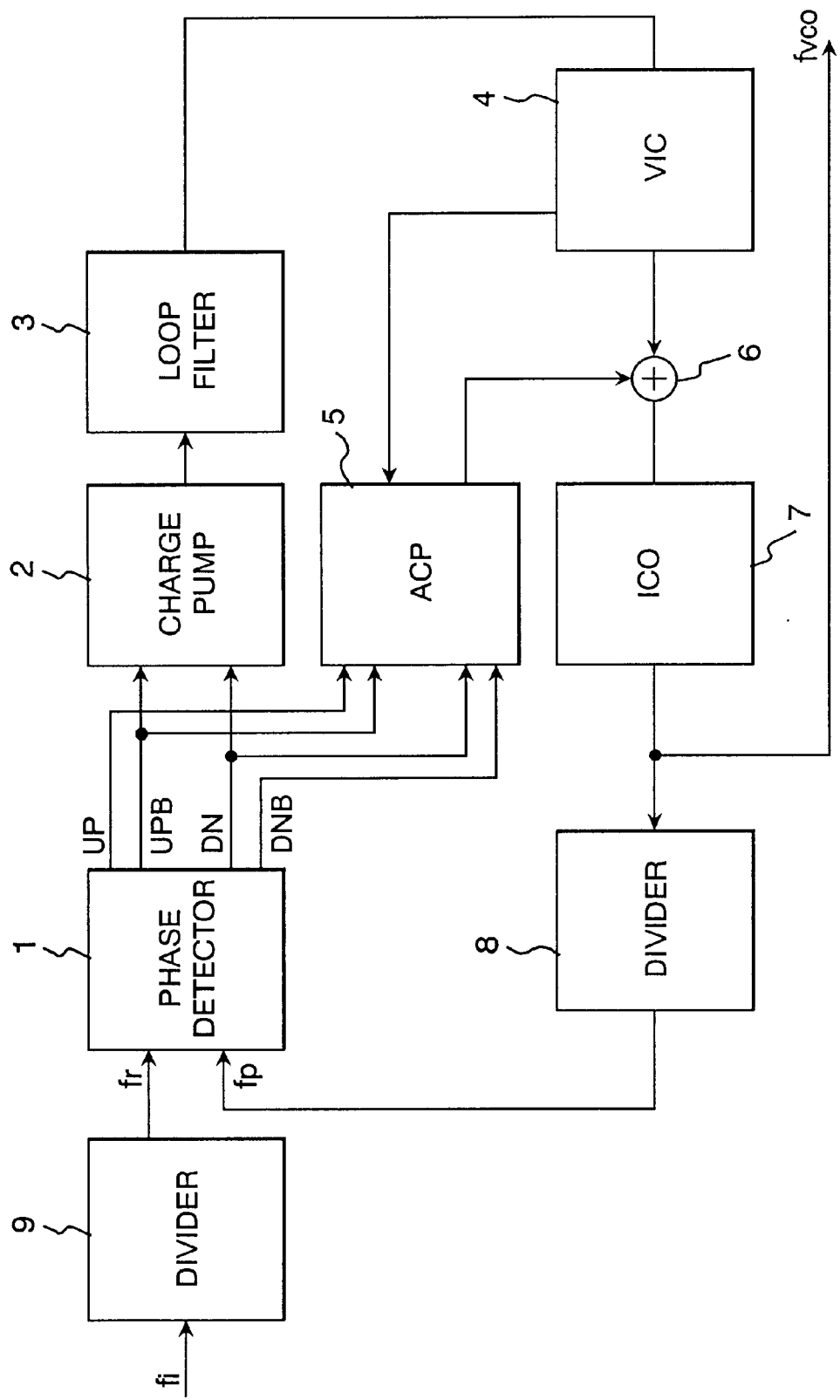
FIG. 4 is a constitution diagram for explaining a first embodiment of PLL using the variable frequency oscillator according to the present invention.
Figure 5:
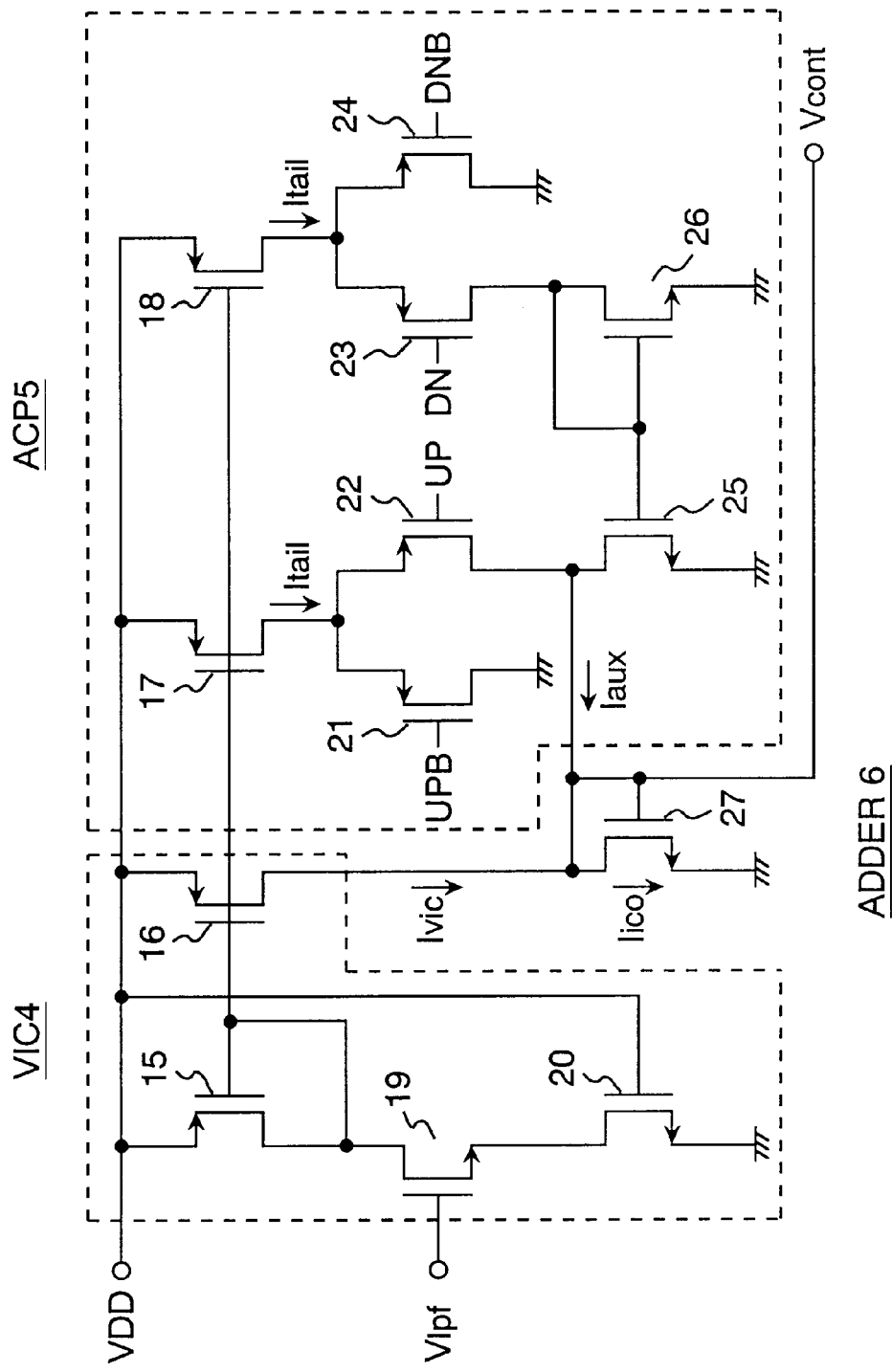
FIG. 5 is a circuit diagram for explaining an example of a voltage-to-current converter and an auxiliary charge pump used in PLL according to the first embodiment.

Next, FIG. 4 shows the constitution of PLL adopting the variable frequency oscillator mentioned above. A total constitution thereof is basically the same as the constitution shown by FIG. 11 except a wiring by which ACP 5 receives an output signal from VIC 4 and the variable frequency oscillator of the embodiment is designated by notation ICO 7. FIG. 5 shows VIC 4, ACP 5 and the adder 6 adopted in PLL of the embodiment. Other circuits except ICO 7 are the same as the conventional circuits explained above and accordingly, an explanation thereof will be omitted. In FIG. 5, dotted lines on the left side designate VIC 4, dotted lines widely surrounding the right side designate ACP 5, and a transistor 27 and its surrounding constitute the adder 6. The adder 6 outputs a control signal Vcont supplied to ICO 7.

VIC 4 is constituted of a current mirror circuit comprising two transistors 15 and 16, a transistor 19 for converting a control voltage signal Vlpf outputted from the loop filter 3 into a current signal and a transistor 20 which is connected to a source terminal of the transistor 19 and a gate terminal of which is connected to a power source terminal.

By adopting a constitution in which the gate terminal is connected to the power supply terminal in this way, the power supply voltage can be lowered and the transistor 20 can be used to bias to a linear region. The transistor 20 in this case executes operation the same as that of a resistor. Accordingly, the transistor 19 changes the signal Vlpf of the gate terminal into the current under a linear voltage-to-current conversion characteristic and a current signal Ivic which is copied current thereof is outputted from the transistor 16 as an output signal from VIC 4.

Next, ACP 5 is constituted of a first differential circuit comprising transistors 21 and 22, a second differential circuit comprising transistors 23 and 24, a load circuit comprising transistors 25 and 26 connected to the transistors 22 and 23 and two transistors 17 and 18 for supplying current to the first and the second differential circuits. The transistors 25 and 26 constitute a current mirror circuit and become the above-described load circuit.

Input terminals of the first differential circuit are applied with UP signal outputted from the phase detector 1 and UPB signal which is an inverted signal thereof and input terminals of the second differential circuit are applied with DN signal outputted from the phase detector 1 and DNB signal which is an inverted signal thereof. Further, the transistor 17 and the transistor 15 constitute a current mirror circuit and the transistor 18 and the transistor 15 similarly constitute a current mirror circuit and the transistors 17 and 18 respectively output current signals Itail. Accordingly, the current Itail is in a proportional relationship with the current Ivic and corresponds to the signal Vlpf. That is, connection from VIC 4 to ACP 5 shown by FIG. 5 is carried out by connection for forming the current mirror circuits from the transistor 15 to the transistors 17 and 18.

ACP 5 determines ON/OFF of the two differential circuits in accordance with states 1 or 0 of UP signal and DN signal, as a result, outputs a feed forward current signal Iaux which is not processed by the loop filter 3. Further, in this case, UP signal and DN signal are made effective when they are 0.

Hereinafter, an explanation will be given of the operation of ACP 5 outputting the current Iaux by classifying the operation in accordance with four cases which UP signal and DN signal can make. In this case, the direction of current is designated by using positive and negative (+, −) signs.

(1) A case where UP signal is 0 and DN signal is 1:

The current Itail given from the transistors 17 and 18 flows to the transistor 22 and the transistor 24. As a result, the current Itail becomes the output current Iaux via the transistor 22. That is, Iaux=Itail. The current Iaux is added to the current Ivic.

(2) A case where UP signal is 1 and DN signal is 0:

The current Itail flows to the transistor 21 and the transistor 23. As a result, by the operation of the current mirror circuit of the transistors 25 and 26, the current Itail flows to the transistor 25. That is, Iaux=−Itail.

(3) A case where UP signal is 1 and DN signal is 1:

The current Itail flows to the transistor 21 and the transistor 24. As a result, no current flows in the transistor 22 and the transistor 23 and Iaux=0.

(4) A case where UP signal is 0 and DN signal is also 0:

Although the current Itail flows to the transistor 22 and the transistor 23, a value of current flowing to the transistor 22 is equal to a value of current flowing to the transistor 25 and similarly, Iaux=0.

Now, the transistor 27 constitutes a current mirror circuit along with each controlling transistor 38 for controlling each of the delay cells 28-1 through 28-4. The current Ivic and the current Iaux are added together and are inputted to the transistor 27 constituting a prestage of the current mirror circuit. Current Iico=Ivic+Iaux flows to the transistor 27 and the transistor forms the frequency control signal Vcont for the controlling transistor 38 outputting the control current in correspondence with the current Iico.

Correspondence between the four conditions and the current Iico is summarized as follows.

TABLE 1

| UP | DOWN | Iaux | Iico |
|----|------|------|------|
| 0 | 1 | + Itail | Ivic + Itail |
| 1 | 0 | − Itail | Ivic − Itail |
| 1 | 1 | 0 | Ivic |
| 0 | 0 | 0 | Ivic |

In this case, the feed forward current signal Iaux formed by ACP 5 is changed in accordance with the control signal Vlpf outputted from the loop filter 3, that is, in accordance with the oscillation frequency and therefore, as mentioned above, jitter generated by PLL can be restrained and the range of the oscillation frequency can be widened. Further, the signal Iaux can be fixed depending on other object of use where the range of the oscillation frequency is not widened or the like. In that case, arbitrary fixed bias voltage is applied to gate terminals of the transistors 17 and 18 and the current Itail is made to be fixed current. Also by the current Itail, the zero point can be formed in the transfer function of the feedback loop.

An important point with regard to the current Itail resides in that a relationship between the current Ivic given by VIC 4 and the current Iaux given by ACP 5 is determined such that the feedback loop of PLL is stabilized. The embodiment is constituted such that the relationship can be determined by a current mirror ratio of the transistor 15 and the transistors 17 and 18. The current mirror ratio is set such that the size of the transistors 17 and 18 substantially falls in a range smaller than a half of the size of the transistor 15. Further, the present invention is not limited to the ratio but other ratio can be adopted so far as it is a value capable of ensuring stability of the feedback loop.

Figure 6:
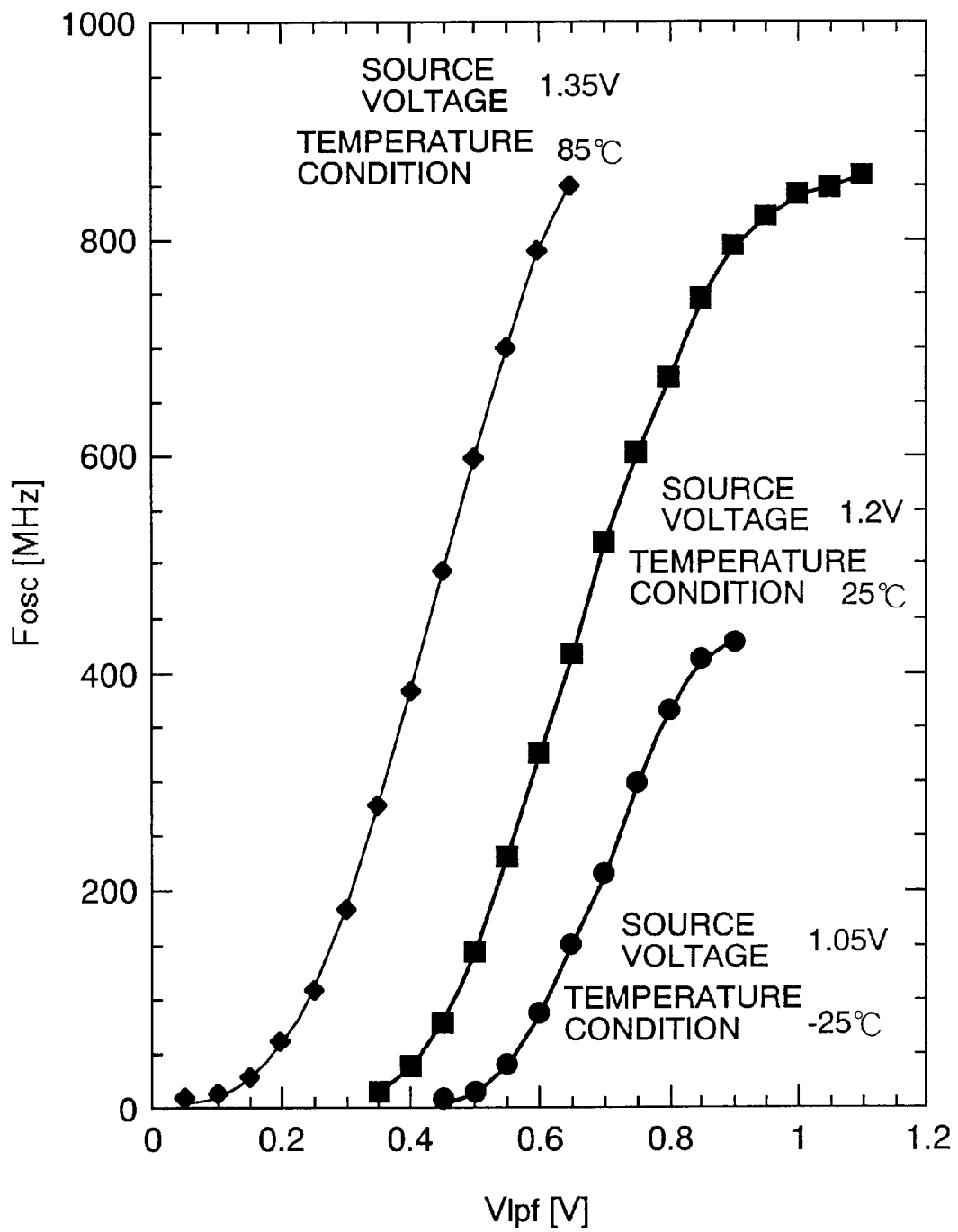
FIG. 6 shows curves for explaining a relationship between a control voltage and an oscillation frequency of the variable frequency oscillator according to the present invention.

At this stage, FIG. 6 shows a simulation result of the oscillation frequency of the variable frequency oscillator according to the embodiment. The abscissa of FIG. 6 designates the control signal Vlpf inputted to the voltage-to-current converter according to the embodiment of the present invention and the ordinate designates the oscillation frequency Fosc. The simulation is carried out under three conditions of different power source voltages. As shown by FIG. 6, the oscillation frequency which is equal to or higher than 400 MHz is obtained under a condition of the power source voltage of 1.05 V and the oscillation frequency exceeds 800 MHz under the power source voltage of 1.2 V. Further, the lower limit of the oscillation frequency is as low as around 10 MHz and a wide oscillation frequency range is obtained. Such a characteristic can be realized with a number of stages of delay cells as small as 4 stages and the power consumption can be lowered substantially to about 2 mW.

The scale of PLL according to the present invention is small as described above, voltage of power supply can be lowered and the power consumption can be lowered and accordingly, PLL according to the present invention can easily be built in LSI. According to the embodiment, PLL is built in LSI mounted with a microprocessor and the PLL is used as a clock generating circuit of the microprocessor.
(Embodiment 2)

Figure 7:
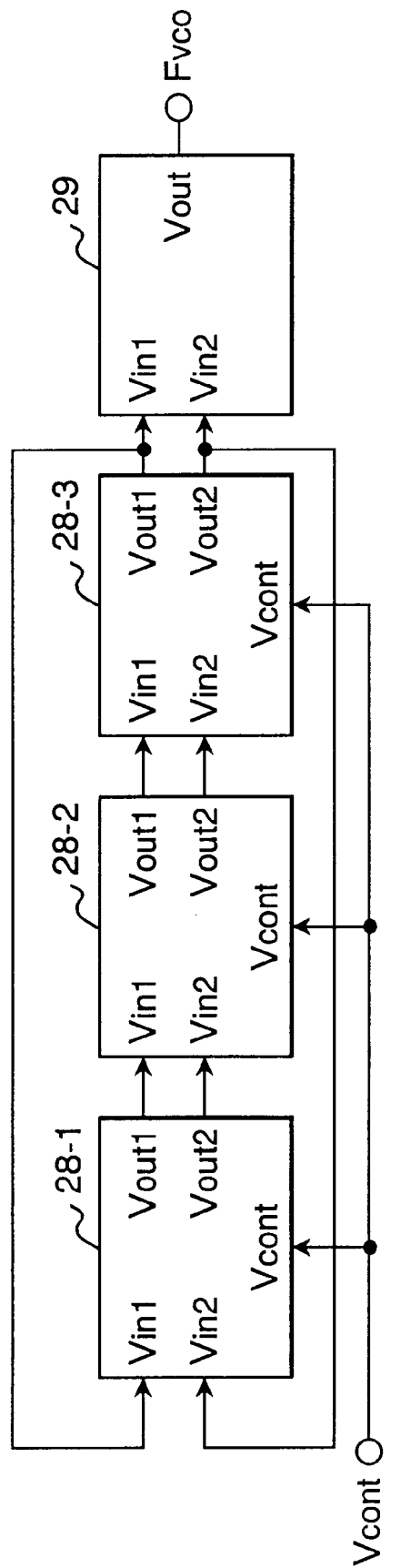
FIG. 7 is a constitution diagram for explaining a second embodiment of a variable frequency oscillator according to the present invention.

FIG. 7 shows a variable frequency oscillator in which a number of stages of cascading delay cells is an odd number. Although an explanation will be given here by using an example of 3 stages thereof, the operation stays the same even with other number of stages as in 5 stages, 7 stages or 9 stages so far as the number of stages is an odd number. Further, connection of the delay cell 28-3 at the final stage to the delay cell 28-1 at the initial stage is the same as the connection between other stages, different from that in the case of the variable frequency oscillator in which the number of stages is an even number.

Figure 8:
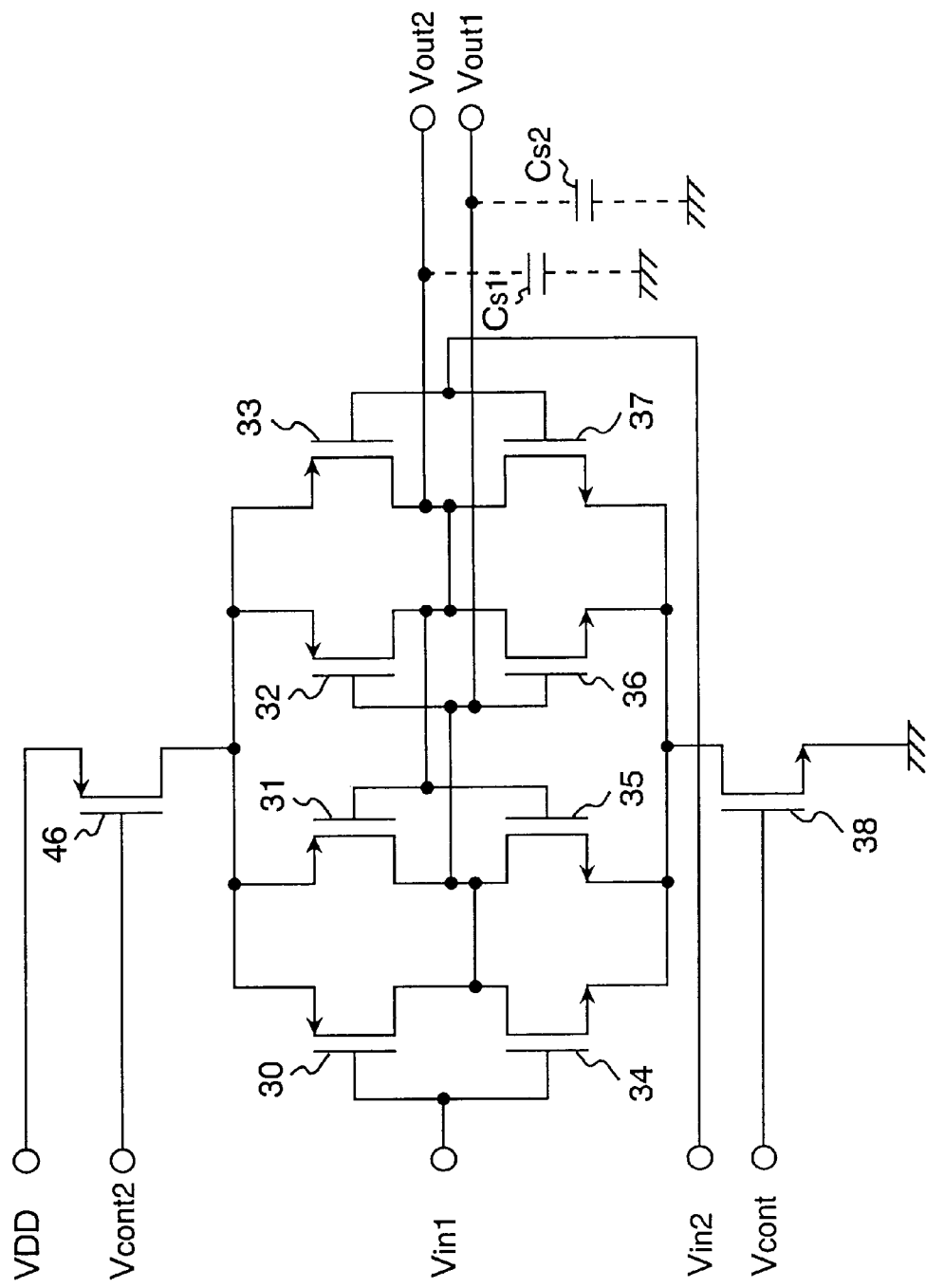
FIG. 8 is a circuit diagram for explaining an example of a delay cell used in the variable frequency oscillator according to the second embodiment.

Although the delay cell according to Embodiment 1 can be adopted, according to the embodiment, there is used a delay cell shown by FIG. 8 in which a controlling transistor is installed particularly on the side of power supply.

In FIG. 8, numeral 46 designates a pMOS transistor connected between the power supply and the common source electrode of the differential amplifier and the positive feedback circuit shown by FIG. 2. Control signal Vcont2 the phase of which is inverted from that of the control signal Vcont is applied to the gate electrode of the transistor 46.

Figure 9:
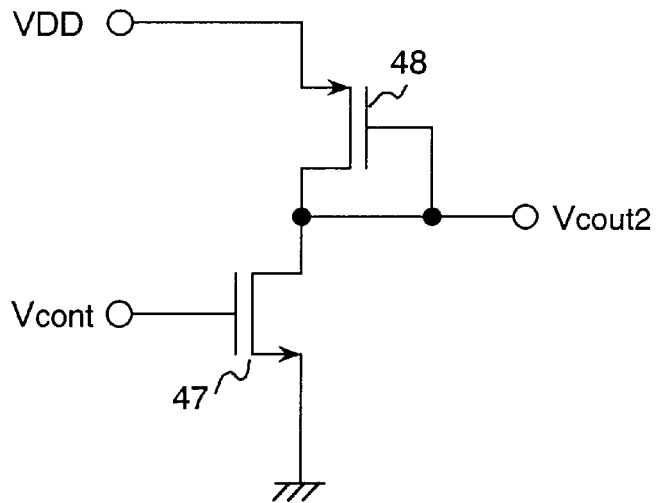
FIG. 9 is a circuit diagram for explaining an example of a control signal forming circuit used in the delay cell of FIG. 8.

FIG. 9 shows a circuit for forming the control signal Vcont2. A transistor 47 inputs the control signal Vcont and outputs a control current similar to that of the transistor 38. A transistor 48 forms a current mirror circuit along with the transistor 46 and forms the control signal Vcont2 for outputting the copied current of the control signal to the transistor 46.

The transistor 46 cooperates with the transistor 38 by receiving the control signal Vcont2 and carries out current control. The current supply ability of the transistor 46 is made larger than the current supply ability of the transistors 30 and 33 and charge current to the capacitances Cs1 and Cs2 is determined only by the transistor 46.

By using the above-described constitution, control current and accordingly, the delay amount can be controlled by both of the transistors 38 and 46 and accordingly, the oscillation frequency can be controlled in a range wider than that in using the delay cell shown by FIG. 2. Further, the power supply voltage is increased by voltage necessary for shifting the transistor 46 to the saturation region (about 0.3 V).
(Embodiment 3)

Although according to the above-described embodiments, PLL according to the present invention is used as a clock generating circuit of a microprocessor, the present invention is not limited to such a way of use but is applicable as a clock supply circuit in a clock synchronizer for ensuring synchronism of phases of a semiconductor inner circuit at inside of LSI and a peripheral semiconductor integrated circuit (hereinafter, abbreviated as "IC") shown by, for example, FIG. 10.

Figure 10:
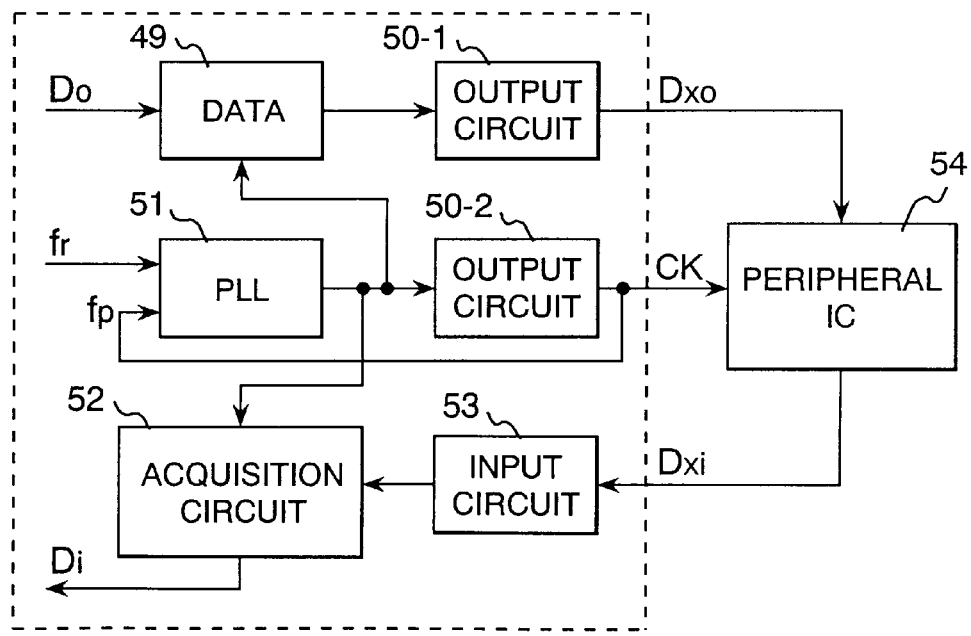
FIG. 10 is a constitution diagram for explaining a third embodiment of the present invention.
Figure 11:
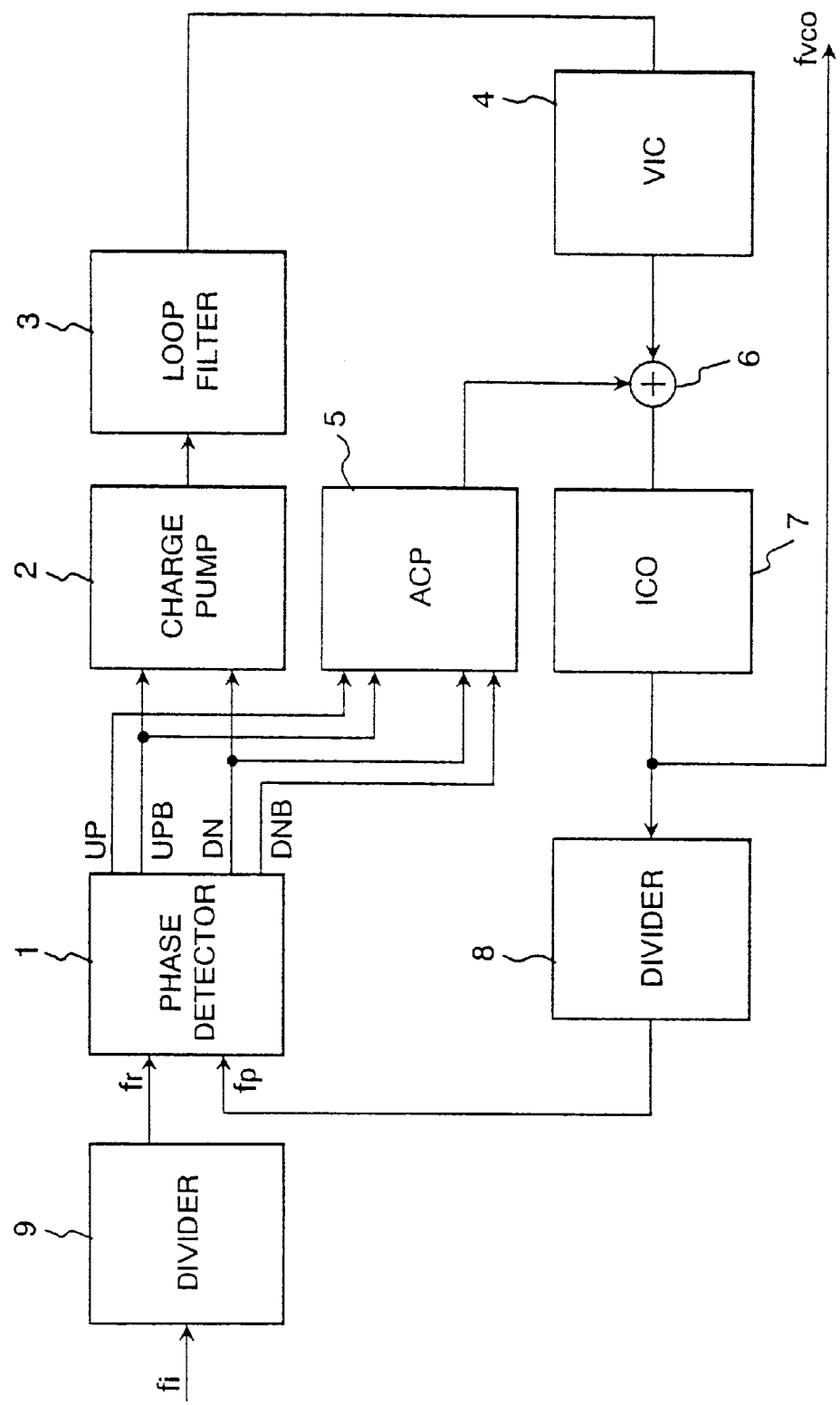
FIG. 11 is a constitution diagram for explaining conventional PLL.
Figure 12:
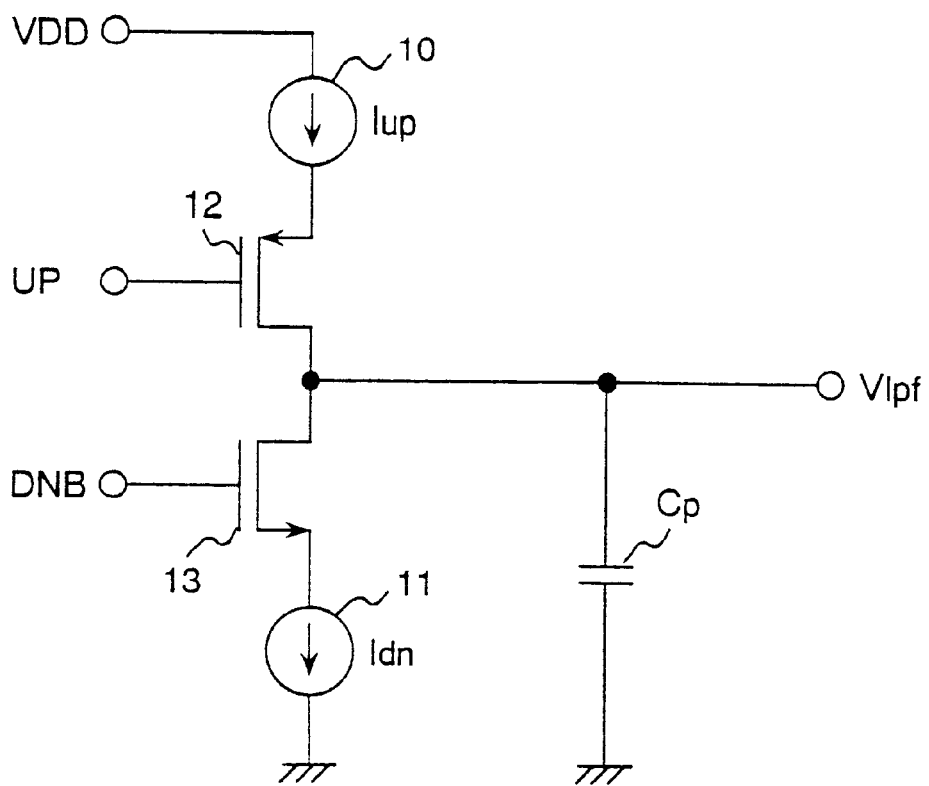
FIG. 12 is a circuit diagram for explaining a conventional charge pump and a loop filter.
Figure 13:
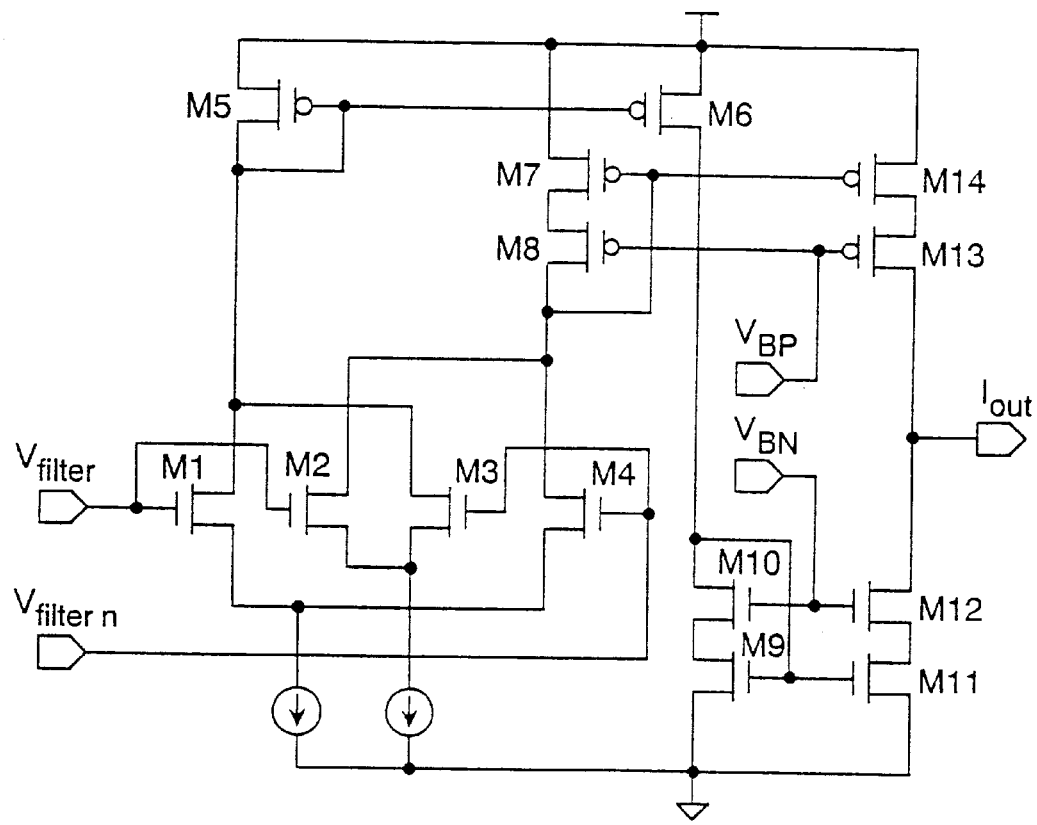
FIG. 13 is a circuit diagram for explaining a conventional voltage-to-current converter.
Figure 14:
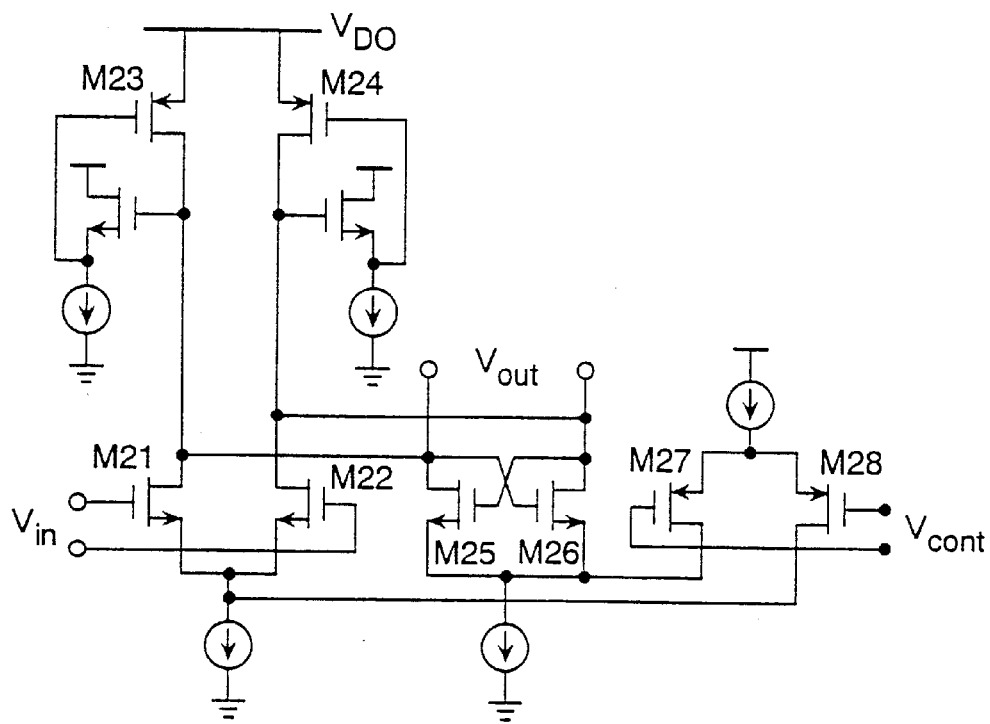
FIG. 14 is a circuit diagram for explaining a conventional delay cell.

FIG. 10 shows a constitution in which data Dxo is outputted from a semiconductor inner circuit (within dotted lines), the data Dxo is processed at the peripheral IC 54 and data Dxi as a result thereof is again acquired by the semiconductor inner circuit. In this case, both the semiconductor inner circuit and the peripheral IC 54 need to operate by clocks having the same phase. A clock synchronizer therefor is constituted of PLL 51 according to the present invention, two of output circuit 50-1 and 50-2, a data generator 49, an input circuit 53 and an acquisition circuit 52. However, the number of the input circuit 53 and the output circuits 50-1 and 50-2 is not limited to a total of three but to a number necessary for exchanging data with the peripheral IC 54 is prepared. In this case, for simplification, an explanation will be given thereof with the number of three.

Data Do from a predetermined block of the semiconductor inner circuit to the peripheral IC 54 becomes data Dxo via the data generator 49 and the output circuit 50-1. Further, a clock CK for operating the peripheral IC 54 is outputted from the output circuit 50-2 connected to PLL 51 oscillating in synchronism with a reference signal fr. Further, the signal outputted from the output circuit 50-2 becomes a comparison signal fp of PLL 51 by being branched from the clock CK.

Further, data Dxi outputted from the peripheral IC 54 becomes data Di by being inputted to the acquisition circuit 52 via the input circuit 53 and is transmitted to a predetermined other block of the semiconductor inner circuit. A control clock to the data generator 49 and the acquisition circuit 52 is outputted from PLL 51.

When generally, a peripheral IC is driven by an semiconductor inner circuit, a load capacitance is frequently increased to be equal to or more than several pFs. In that case, it is unavoidable that delay amounts of the output circuits 50-1 and 50-2 are increased and there poses a problem in which operational speed of a total thereof is significantly deteriorated. As shown by FIG. 10, by using the output signal from the output circuit 50-2 for the comparison signal fp of PLL 51 and using the output signal from PLL 51 for the control clock of the data generator 49 and the acquisition circuit 52, the delay amounts of the output circuit 50-1 and the output circuit 50-2 can be corrected. By the constitution shown by FIG. 10, phases of the clocks of the semiconductor inner circuit and the peripheral IC can be made to coincide with each other and the total can be operated at high speed.

According to the present invention, by using the delay cells having the circuit constitution capable of adopting transistors operating in the resistance region, there can be realized the variable frequency oscillator capable of executing high frequency oscillating operation at low power supply voltage. Further, by suing the variable frequency oscillator, the voltage-to-current converter using the transistor the gate electrode of which is biased to voltage higher than that of the drain electrode and the auxiliary charge pump in which the feed forward current is changed in accordance with the oscillation frequency, there can be realized PLL operating at low power supply voltage and having a wide range of the oscillation frequency.

PLL can be built in LSI since it operates at low power supply voltage and can constitute a clock generator for a microprocessor comprising LSI having large scale and high function.

It is further understood by those skilled in the art that the foregoing description is a preferred embodiment of the disclosed device and that various changes and modifications may be made in the invention without departing from the spirit and scope thereof.

What is claimed is:

1. A variable frequency oscillator comprising:
plural delay cells which are cascaded and in which an output of a final cell is fed back to an input of a first stage delay cell,
each of the plural delay cells having a variable delay amount and comprising a differential amplifier and a positive feedback circuit, the differential amplifier for inputting and amplifying differential signals polarities of which are inverted from each other, the positive feedback circuit comprising two amplifiers whose first input and first output terminals are connected to intersect with each other and are connected to second output terminals of the differential amplifier;

wherein the differential amplifier is formed by first amplifier elements and the two amplifiers forming the positive feedback circuit are constituted by second amplifier elements, each of the first amplifier elements and the second amplifier elements being a complementary amplifier which is formed by a pMOS (Metal Oxide Semiconductor) transistor and an nMOS transistor connected in series, the complementary amplifier having an input terminal formed by connecting together gate electrodes of the pMOS transistor and the nMOS transistor and an output terminal formed by connecting together drain electrodes thereof, wherein each of the plural delay cells has a controlling MOS transistor for controlling a source current of the complementary amplifier, and the controlling MOS transistor and each of the complimentary amplifiers are connected in series between a power supply terminal and a ground terminal, and wherein a voltage-to-current conversion gain of each of the pMOS transistor and the nMOS transistor of the complementary amplifier of the differential amplifier is larger than a voltage-to-current conversion gain of each of the pMOS transistor and the nMOS transistor of the complementary amplifier of the two amplifiers forming the positive feedback circuit.

2. A variable frequency oscillator according to claim 1, wherein a gate width of each of the pMOS transistor and the nMOS transistor of the complementary amplifier for the differential amplifier is larger than a gate width of each of the pMOS transistor and the nMOS transistor of the complementary amplifier for the two amplifiers making the positive feedback circuit.

3. A phase locked loop comprising:

a phase detector for comparing an inputted reference signal with a comparison signal and outputting a phase difference, a charge pump for substituting the phase difference for a first current, an auxiliary charge pump for substituting the phase difference for a second current to thereby form an output signal, a loop filter for charging the first current to a capacitor and providing an output signal represented by a charged voltage of the capacitor, a variable frequency oscillator for changing a frequency in accordance with a signal formed by adding the output signal of the loop filter and the output signal of the auxiliary charge pump and outputting the comparison signal, and a voltage-to-current converter for converting the output signal of the loop filter into a current; and wherein the phase locked loop forms a feedback loop by using the phase detector, the charge pump, the auxiliary charge pump, the loop filter and the variable frequency oscillator, the variable frequency oscillator comprising:
plural delay cells which are cascaded and in which an output of a final cell is fed back to an input of a first stage delay cell,
each of the plural cells having a variable delay amount and comprising a differential amplifier and a positive feedback circuit, the differential amplifier for inputting and amplifying differential signals polarities of which are inverted from each other, the positive feedback circuit comprising two amplifiers first input and first output terminals are connected to intersect with each other and the first input and the first output terminals of which are connected to second output terminals of the differential amplifier;

wherein the differential amplifier is formed by first amplifier elements and the two amplifiers forming the positive feedback circuit are constituted by second amplifier elements, each of the first amplifier elements and the second amplifier elements being a complementary amplifier which is constituted by a pMOS (Metal Oxide Semiconductor) transistor and an nMOS transistor in series, the complementary amplifier having an input terminal formed by connecting together gate electrodes of the pMOS transistor and the nMOS transistor and an output terminal formed by connecting together drain electrodes thereof;

wherein each of the plural delay cells has a controlling MOS transistor for controlling a source current of the complementary amplifier, and the controlling MOS transistor and each of the complimentary amplifiers are connected in series between a power supply terminal and a ground terminal; and wherein the voltage-to-current converter comprises a first MOS transistor for inputting the output signal of the loop filter to a gate electrode thereof and outputting a current from a drain electrode thereof and a second MOS transistor whose drain electrode is connected to a source electrode of the first MOS transistor and in which a gate-to-source voltage is higher than a drain-to-source voltage.

4. A phase locked loop according to claim 3, wherein a gate electrode and a source electrode of the second MOS transistor are connected between a power supply terminal and a ground terminal.

5. A phase locked loop comprising:

a phase detector for comparing an inputted reference signal with a comparison signal and outputting a phase difference, a charge pump for substituting the phase difference for a first current, an auxiliary charge pump for substituting the phase difference for a second current to thereby form an output signal, a loop filter for charging the first current to a capacitor and providing an output signal represented by a charged voltage of the capacitor, a variable frequency oscillator for changing a frequency in accordance with a signal formed by adding the output signal of the loop filter and the output signal of the auxiliary charge pump and outputting the comparison signal, wherein the phase locked loop forms a feedback loop by using the phase detector, the charge pump, the auxiliary charge pump, the loop filter and the variable frequency oscillator, the variable frequency oscillator comprising:
plural delay cells which are cascaded and in which an output of a final cell is fed back to an input of a first stage delay cell,
each of the plural cells having a variable delay amount and comprising a differential amplifier and a positive feedback circuit, the differential amplifier for inputting and amplifying differential signals polarities of which are inverted from each other, the positive feedback circuit comprising two amplifiers first input and first output terminals are connected to intersect with each other and the first input and the first output terminals of which are connected to second output terminals of the differential amplifier;

wherein the differential amplifier is formed by first amplifier elements and the two amplifiers forming the positive feedback circuit are constituted by second amplifier elements, each of the first amplifier elements and the second amplifier elements being a complementary amplifier which is constituted by a pMOS (Metal Oxide Semiconductor) transistor and an nMOS transistor in series, the complementary amplifier having an input terminal formed by connecting together gate electrodes of the pMOS transistor and the nMOS transistor and an output terminal formed by connecting together drain electrodes thereof;

wherein each of the plural delay cells has a controlling MOS transistor for controlling a source current of the complementary amplifier, and the controlling MOS transistor and each of the complimentary amplifiers are connected in series between a power supply terminal and a ground terminal;

wherein the phase detector outputs as the phase difference a control signal for increasing an oscillation frequency of the variable frequency oscillator (hereinafter, referred to as "UP signal"), a control signal for decreasing the oscillation frequency (hereinafter, referred to as "DN signal") and signals respectively inverting the control signals (hereinafter, referred to as "UPB signal, DNB signal" in the above-described order), and the auxiliary charge pump comprises
  a first current source,
  a second current source,
  a first differential circuit for inputting the UP signal and the UPB signal and switching a current of the first current source,
  a second differential circuit for inputting the DN signal and the DNB signal and switching a current of the second current source, and
  a current mirror circuit for copying the current outputted by the second differential circuit when the DN signal is effective; and
  wherein a terminal formed by connecting a terminal to which the second differential circuit outputs the current when the UP signal is effective and a terminal to which the current mirror circuit outputs a copied current is a terminal to which the auxiliary charge pump outputs the output signal thereof.

6. A phase locked loop according to claim 5, wherein the auxiliary charge pump comprises means for changing the currents of the first current source and the second current source in proportion to the output signal of the loop filter.

7. A clock synchronizer provided in a first integrated circuit for carrying out data transmission between the first integrated circuit integrated on a semiconductor substrate and a second integrated circuit integrated on other semiconductor substrate, the clock synchronizer comprising:
  a first output circuit for transmitting data to the second integrated circuit,
  a second output circuit for transmitting a clock to the second integrated circuit,
  an input circuit for receiving data from the second integrated circuit,
  a data generator for supplying data to the first output circuit,
  an acquisition circuit for inputting data from the input circuit, and
  a clock supply circuit for supplying the clock for controlling timings to the data generator and the acquisition circuit and supplying the clock to the second output circuit;
  wherein the clock supply circuit is a phase locked loop having a phase detector, the phase locked loop for inputting a reference signal in the first integrated circuit to one input terminal of the phase detector and inputting the clock outputted from the second output circuit to another input terminal of the phase detector.

8. A clock synchronizer according to claim 7, wherein the phase locked loop comprises:
  a phase detector for comparing an inputted reference signal with a comparison signal and outputting a phase difference,
  a charge pump for substituting the phase difference for a first current,
  an auxiliary charge pump for substituting the phase difference for a second current to thereby form an output signal,
  a loop filter for charging the first current to a capacitor and forming an output signal by a charged voltage of the capacitor, and
  a variable frequency oscillator for changing a frequency in accordance with a signal formed by adding the output signal of the loop filter and the output signal of the auxiliary charge pump and outputting the comparison signal;
  wherein the phase locked loop forms a feedback loop by using the phase detector, the charge pump, the auxiliary charge pump, the loop filter and the variable frequency oscillator, the variable frequency oscillator comprising:
    plural delay cells which are cascaded and in which an output of a final cell is fed back to an input of a first stage delay cell,
    each of the plural delay cells having a variable delay amount and comprising a differential amplifier and a positive feedback circuit, the differential amplifier for inputting and amplifying differential signals whose polarities are inverted from each other, the positive feedback circuit comprising two amplifiers whose first input and first output terminals are connected to intersect with each other and the first input and the first output terminals are connected to second output terminals of the differential amplifier;
    wherein the differential amplifier is constituted by first amplifier elements and the two amplifiers forming the positive feedback circuit are constituted by second amplifier elements, each of the first amplifier elements and the second amplifier elements being a complementary amplifier which is constituted by a pMOS (Metal Oxide Semiconductor) transistor and an nMOS transistor in series, the complementary amplifier having an input terminal formed by connecting together gate electrodes of the pMOS transistor and the nMOS transistor and an output terminal formed by connecting together drain electrodes thereof;
    wherein each of the plural delay cells has a controlling MOS transistor for controlling a source current of the complementary amplifier, and the controlling MOS transistor and each of the complimentary amplifiers are connected in series between a power supply terminal and a ground terminal; and wherein the second output circuit is arranged between an input terminal for inputting the comparison signal of the phase detector and an output terminal of the variable frequency oscillator.

9. A clock synchronizer according to claim 7, wherein the phase locked loop comprises a phase detector for comparing an inputted reference signal with a comparison signal and outputting a phase difference, a charge pump for substituting the phase difference for a first current, an auxiliary charge pump for substituting the phase difference for a second current to thereby form constitute an output signal, a loop filter for charging the first current to a capacitor and forming an output signal by a charged voltage of the capacitor, and a variable frequency oscillator for changing a frequency in accordance with a signal formed by adding the output signal of the loop filter and the output signal of the auxiliary charge pump and outputting the comparison signal;

wherein the phase locked loop forms a feedback loop by using the phase detector, the charge pump, the auxiliary charge pump, the loop filter and the variable frequency oscillator, the variable frequency oscillator comprising:

plural delay cells which are cascaded and in which an output of a final cell is fed back to an input of a first stage delay cell, each of the plural delay cells having a variable delay amount and comprising a differential amplifier and a positive feedback circuit, the differential amplifier for inputting and amplifying differential signals polarities of which are inverted from each other, the positive feedback circuit comprising two amplifiers whose first input and first output terminals are connected to intersect with each other and the first input and the first output terminals are connected to second output terminals of the differential amplifier;

wherein the differential a amplifier is formed by first amplifier elements and the two amplifiers forming the positive feedback circuit are formed by second amplifier elements, each of the first amplifier elements and the second amplifier elements being a complementary amplifier which is formed by a pMOS (Metal Oxide Semiconductor) transistor and an nMOS transistor connected in series, the complementary amplifier having an input terminal formed by connecting together gate electrodes of the pMOS transistor and the nMOS transistor and an output terminal formed by connecting together drain electrodes thereof;

wherein each of the plural delay cells has a controlling pMOS transistor for controlling a source current of the pMOS transistor and a controlling nMOS transistor for controlling a source current of the nMOS transistor, and the controlling pMOS transistor, the controlling nMOS transistor and each of the complimentary amplifiers are connected in series between a power supply terminal and a ground terminal, and wherein the second output circuit is arranged between an input terminal for inputting the comparison signal of the phase detector and an output terminal of the variable frequency oscillator.

10. A variable frequency oscillator comprising:

plural delay cells which are cascaded and in which an output of a final cell is fed back to an input of a first stage delay cell, each of the plural delay cells having a variable delay amount and comprising a differential amplifier and a positive feedback circuit, the differential amplifier for inputting and amplifying differential signals polarities of which are inverted from each other, the positive feedback circuit comprising two amplifiers whose first input and first output terminals are connected to intersect with each other and are connected to second output terminals of the differential amplifier;

wherein the differential amplifier is formed by first amplifier elements and the two amplifiers forming the positive feedback circuit are constituted by second amplifier elements, each of the first amplifier elements and the second amplifier elements being a complementary amplifier which is formed by a pMOS (Metal Oxide Semiconductor) transistor and an nMOS transistor connected in series, the complementary amplifier having an input terminal formed by connecting together gate electrodes of the pMOS transistor and the nMOS transistor and an output terminal formed by connecting together drain electrodes thereof, wherein each of the plural delay cells has a controlling pMOS transistor for controlling a source current of the pMOS transistor and a controlling nMOS transistor for controlling the source current of the nMOS transistor, and the controlling pMOS transistor, the controlling nMOS transistor and each of the complimentary amplifiers are connected in series between a power supply terminal and a ground terminal, and wherein a voltage-to-current conversion gain of each of the pMOS transistor and the nMOS transistor of the complementary amplifier for the differential amplifier is larger than a voltage-to-current conversion gain of each of the pMOS transistor and the nMOS transistor of the complementary amplifier for the two amplifiers making the positive feedback circuit.

11. A variable frequency oscillator according to claim 10, wherein a gate width of each of the pMOS transistor and the nMOS transistor of the complementary amplifier for the differential amplifier is larger than a gate width of each of the pMOS transistor and the nMOS transistor of the complementary amplifier for the two amplifiers making he positive feedback circuit.

12. A phase locked loop comprising:

a phase detector for comparing an inputted reference signal with a comparison signal and outputting a phase difference, a charge pump for substituting the phase difference for a first current, an auxiliary charge pump for substituting the phase difference for a second current to thereby form an output signal, a loop filter for charging the first current to a capacitor and providing an output signal represented by a charged voltage of the capacitor, a variable frequency oscillator for changing a frequency in accordance with a signal formed by adding the output signal of the loop filter and the output signal of the auxiliary charge pump and outputting the comparison signal, and a voltage-to-current converter for converting the output signal of the loop filter into a current, wherein the phase locked loop forms a feedback loop by using the phase detector, the charge pump, the auxiliary charge pump, the loop filter and the variable frequency oscillator, the variable frequency oscillator comprising:

plural delay cells which are cascaded and in which an output of a final cell is fed back to an input of a first stage delay cell, each of the plural cells having a variable delay amount and comprising a differential amplifier and a positive feedback circuit, the differential amplifier for inputting and amplifying differential signals polarities of which are inverted from each other, the positive feedback circuit comprising two amplifiers first input and first output terminals are connected to intersect with each other and the first input and the first output terminals are connected to second output terminals of the differential amplifier;

wherein the differential amplifier is formed by first amplifier elements and the two amplifiers forming the positive feedback circuit are constituted by second amplifier elements, each of the first amplifier elements and the second amplifier elements being a complementary amplifier which is constituted by a pMOS (Metal Oxide Semiconductor) transistor and an nMOS transistor in series, the complementary amplifier having an input terminal formed by connecting together gate electrodes of the pMOS transistor and the nMOS transistor and an output terminal formed by connecting together drain electrodes thereof;

wherein each of the plural delay cells has a controlling pMOS transistor for controlling a source current of the pMOS transistor and a controlling nMOS transistor for controlling a source current of the nMOS transistor, and the controlling pMOS transistor, the controlling nMOS transistor and each of the complimentary amplifiers are connected in series between a power supply terminal and a ground terminal, and wherein the voltage-to-current converter comprises a first MOS transistor for inputting the output signal of the loop filter to a gate electrode thereof and outputting a current from a drain electrode thereof and a second MOS transistor a drain electrode of which is connected to a source electrode of the first MOS transistor and in which a gate-to-source voltage is higher than a drain-to-source voltage.

13. A phase locked loop according to claim 12, wherein a gate electrode and a source electrode of the second MOS transistor are connected between a power supply terminal and a ground terminal.

14. A phase locked loop comprising:

a phase detector for comparing an inputted reference signal with a comparison signal and outputting a phase difference, an auxiliary charge pump for substituting the phase difference for a second current to thereby form an output signal, a loop filter for charging the first current to a capacitor and providing an output signal represented by a charged voltage of the capacitor, a variable frequency oscillator for changing a frequency in accordance with a signal formed by adding the output signal of the loop filter and the output signal of the auxiliary charge pump and outputting the comparison signal, and a voltage-to-current converter for converting the output signal of the loop filter into a current, wherein the phase locked loop forms a feedback loop by using the phase detector, the charge pump, the auxiliary charge pump, the loop filter and the variable frequency oscillator, the variable frequency oscillator comprising:

plural delay cells which are cascaded and in which an output of a final cell is fed back to an input of a first stage delay cell, each of the plural cells having a variable delay amount and comprising a differential amplifier and a positive feedback circuit, the differential amplifier for inputting and amplifying differential signals polarities of which are inverted from each other, the positive feedback circuit comprising two amplifiers first input and first output terminals are connected to intersect with each other and the first input and the first output terminals of which are connected to second output terminals of the differential amplifier;

wherein the differential amplifier is formed by first amplifier elements And the two amplifiers forming the positive feedback circuit are constituted by second amplifier elements, each of the first amplifier elements and the second amplifier elements being a complementary amplifier which is constituted by a pMOS (Metal Oxide Semiconductor) transistor and an nMOS transistor in series, the complementary amplifier having an input terminal formed by connecting together gate electrodes of the pMOS transistor and the nMOS transistor and an output terminal formed by connecting together drain electrodes thereof;

wherein each of the plural delay cells has a controlling pMOS transistor for controlling a source current of the pMOS transistor and a controlling nMOS transistor for controlling a source current of the nMOS transistor, and the controlling pMOS transistor, the controlling nMOS transistor and each of the complimentary amplifiers are connected in series between a power supply terminal and a ground terminal;

wherein the phase detector outputs as the phase difference a control signal for increasing an oscillation frequency of the variable frequency oscillator (hereinafter, referred to as "UP signal"), a control signal for decreasing the oscillation frequency (hereinafter, referred to as "DN signal") and signals respectively inverting the control signals (hereinafter, referred to as "UPB signal, DNB signal" in the above-described order), and the auxiliary charge pump comprises:

a first current source, a second current source, a first differential circuit for inputting the UP signal and the UPB signal and switching a current of the first current source, a second differential circuit for inputting the DN signal and the DNB signal and switching a current of the second current source, and a current mirror circuit for copying the current outputted by the second differential circuit when the DN signal is effective; and wherein a terminal formed by connecting a terminal to which the second differential circuit outputs the current when the UP signal is effective and a terminal to which the current mirror circuit outputs a copied current is a terminal to which the auxiliary charge pump outputs the output signal thereof.

15. A phase locked loop according to claim 14, wherein the auxiliary charge pump comprises means for changing the currents of the first current source and the second current source in proportion to the output signal of the loop filter.

16. A variable frequency oscillator comprising:

plural delay cells which are cascaded and in which an output of a final cell is fed back to an input of a first stage delay cell, each of the plural delay cells having a variable delay amount and comprising a differential amplifier and a positive feedback circuit, the differential amplifier for inputting and amplifying differential signals polarities of which are inverted from each other, the positive feedback circuit comprising two amplifiers whose first input and first output terminals are connected to intersect with each other and the first input and the first output terminals are connected to second output terminals of the differential amplifier;

wherein the differential amplifier is formed by first amplifier elements and the two amplifiers forming the positive feedback circuit are formed by second amplifier elements, each of the first amplifier elements and the second amplifier elements being a complementary amplifier which is formed by a pMOS (Metal Oxide Semiconductor) transistor and an nMOS transistor in series, the complementary amplifier having an input terminal formed by connecting together gate electrodes of the pMOS transistor and the nMOS transistor and an output terminal formed by connecting together drain electrodes thereof; and wherein each of the plural delay cells has a controlling MOS transistor for controlling a source current of the complementary amplifier, the controlling MOS transistor provided commonly to the complimentary amplifiers constituting the differential amplifier and the positive feedback circuit, and the controlling MOS transistor and the complementary amplifiers are connected in series between a power supply terminal and a ground terminal.

* * * * *